United States Patent
Kameoka

(10) Patent No.: US 11,677,382 B2
(45) Date of Patent: Jun. 13, 2023

(54) FILTER DEVICE

(71) Applicant: Murata Manufacturing Co., Ltd., Nagaokakyo (JP)

(72) Inventor: Yoshinori Kameoka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 253 days.

(21) Appl. No.: 17/014,160

(22) Filed: Sep. 8, 2020

(65) Prior Publication Data

US 2021/0083651 A1    Mar. 18, 2021

(30) Foreign Application Priority Data

Sep. 18, 2019 (JP) .............................. JP2019-169404

(51) Int. Cl.
  *H03H 9/54* (2006.01)
  *H03H 9/70* (2006.01)
  *H03H 9/56* (2006.01)
  *H03H 9/13* (2006.01)

(52) U.S. Cl.
  CPC .............. *H03H 9/568* (2013.01); *H03H 9/13* (2013.01); *H03H 9/542* (2013.01); *H03H 9/70* (2013.01)

(58) Field of Classification Search
  CPC .................................. H03H 9/54; H03H 9/70
  See application file for complete search history.

(56) References Cited

U.S. PATENT DOCUMENTS

| | | | |
|---|---|---|---|
| 9,559,661 B2 * | 1/2017 | Inoue | H03H 9/54 |
| 9,806,693 B2 * | 10/2017 | Takamine | H03H 9/6483 |
| 10,250,230 B2 * | 4/2019 | Ono | H03H 9/64 |
| 10,361,679 B2 * | 7/2019 | Takata | H03H 9/6476 |
| 10,447,239 B2 * | 10/2019 | Takahashi | H03H 9/02992 |
| 2016/0173061 A1 | 6/2016 | Takamine | |
| 2016/0173062 A1 * | 6/2016 | Takamine | H03H 9/6433 333/133 |
| 2018/0152191 A1 | 5/2018 | Niwa et al. | |

FOREIGN PATENT DOCUMENTS

| | | | |
|---|---|---|---|
| JP | 2018-088678 A | 6/2018 | |
| KR | 10-2016-0043100 A | 4/2016 | |
| WO | WO-2018118489 A1 * | 6/2018 | H03H 9/0566 |

* cited by examiner

*Primary Examiner* — Hafizur Rahman
*Assistant Examiner* — Alan Wong
(74) *Attorney, Agent, or Firm* — Keating & Bennett, LLP

(57) ABSTRACT

A filter device includes a first path, a second path, and a capacitor. The first path includes at least one ladder filter circuit and connects a first terminal and a second terminal. The at least one ladder filter circuit includes a parallel arm resonator connected to a ground terminal. The second path includes a grounded resonator and is connected in parallel with any of the at least one ladder filter circuit. One end of the capacitor is connected to the second path, and the other end of the capacitor is connected to a third path which connects the parallel arm resonator and the ground terminal.

20 Claims, 13 Drawing Sheets

FILTER DEVICE

CROSS REFERENCE TO RELATED APPLICATIONS

This application claims the benefit of priority to Japanese Patent Application No. 2019-169404 filed on Sep. 18, 2019. The entire contents of this application are hereby incorporated herein by reference.

BACKGROUND OF THE INVENTION

1. Field of the Invention

The present invention relates to a filter device.

2. Description of the Related Art

Hitherto, a filter device that allows signals of a specific frequency band to pass therethrough is mounted on a wireless communication apparatus, such as a cellular phone. For example, a filter device that separates signals of different frequency bands, such as a transmit signal and a received signal, from each other is mounted.

Japanese Unexamined Patent Application Publication No. 2018-88678 discloses a filter device using a ladder filter circuit. More specifically, in this filter device, a loop circuit is disposed in parallel with the ladder filter circuit, thereby improving the isolation characteristics of the filter device.

Typically, a parallel arm resonator in a ladder filter circuit generates an attenuation pole by utilizing sub-resonance formed in a radio-frequency band of about several gigahertz, thereby contributing to the attenuation of a radio-frequency signal. To adjust the frequency band of a signal to be attenuated by sub-resonance, it is necessary to control the attenuation pole generated by the sub-resonance. For example, it is desirable that a filter device used for Wi-Fi (registered trademark) communication is able to adjust the attenuation pole generated by sub-resonance.

To shift the attenuation pole generated by sub-resonance to the lower frequency side, for example, the capacitance of a parallel arm resonator of a ladder filter circuit may be increased. Increasing the capacitance of a parallel arm resonator, however, makes it difficult to reduce the size of the filter device.

SUMMARY OF THE INVENTION

Preferred embodiments of the present invention provide filter devices which are each able to shift an attenuation pole generated by sub-resonance to a lower frequency side while achieving a small size of the filter device.

According to a preferred embodiment of the present invention, a filter device includes a first path, a second path, and a capacitor. The first path includes at least one ladder filter circuit and connects a first terminal and a second terminal. The at least one ladder filter circuit includes a parallel arm resonator connected to a ground terminal. The second path includes a grounded resonator and is connected in parallel with any of the at least one ladder filter circuit. One end of the capacitor is connected to the second path, and the other end of the capacitor is connected to a third path which connects the parallel arm resonator and the ground terminal.

According to a preferred embodiment of the present invention, it is possible to provide a filter device which is able to shift the attenuation pole generated by sub-resonance to the lower frequency side while achieving a small size of the filter device.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
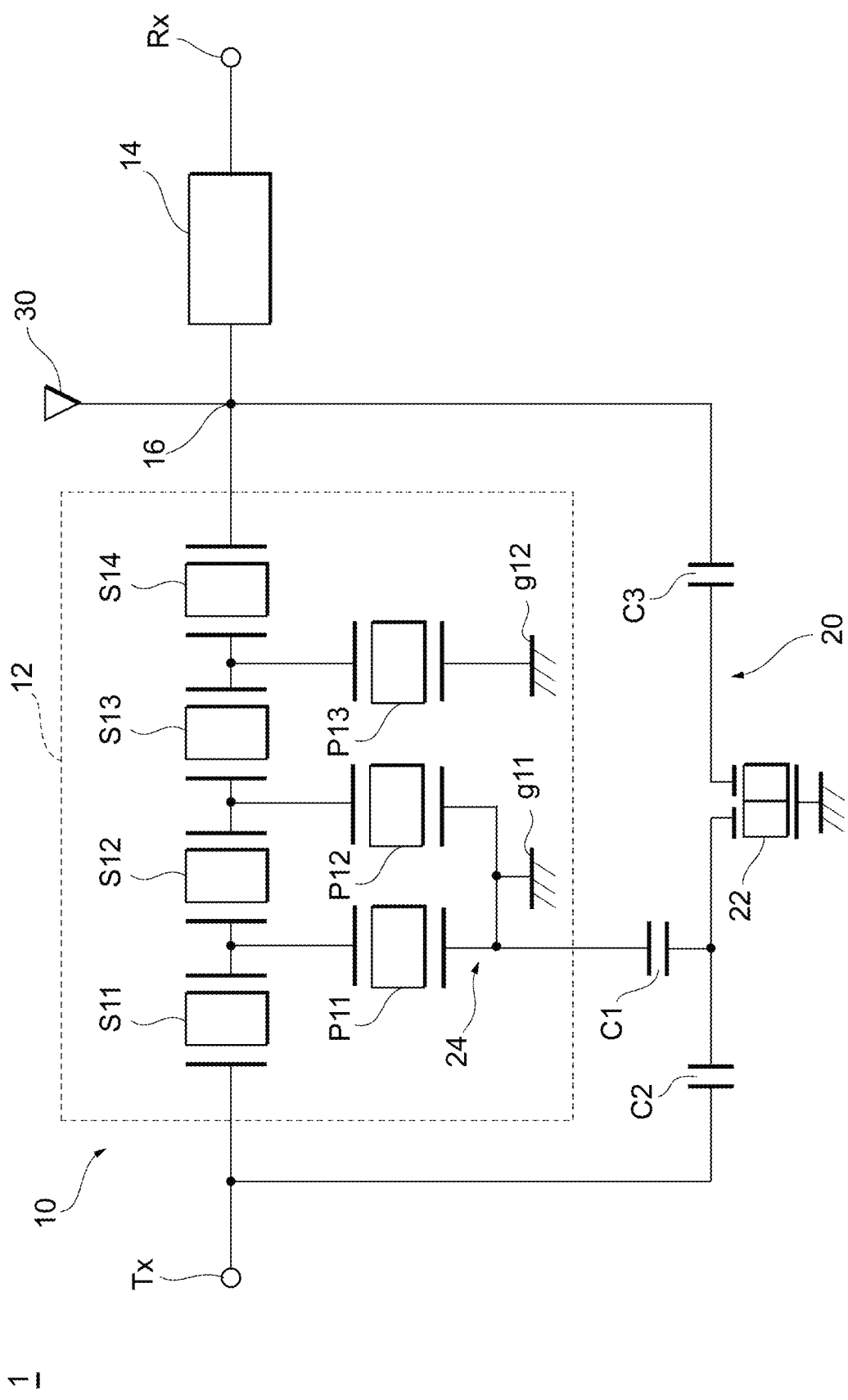
FIG. 1 is a circuit diagram of a filter device according to a first preferred embodiment of the present invention.

Preferred embodiments of the present invention will be described below with reference to the accompanying drawings. The same or similar elements are designated by the same reference numerals in the drawings.

1. First Preferred Embodiment

1.1. Circuit Diagram of Filter Device

Figure 2:
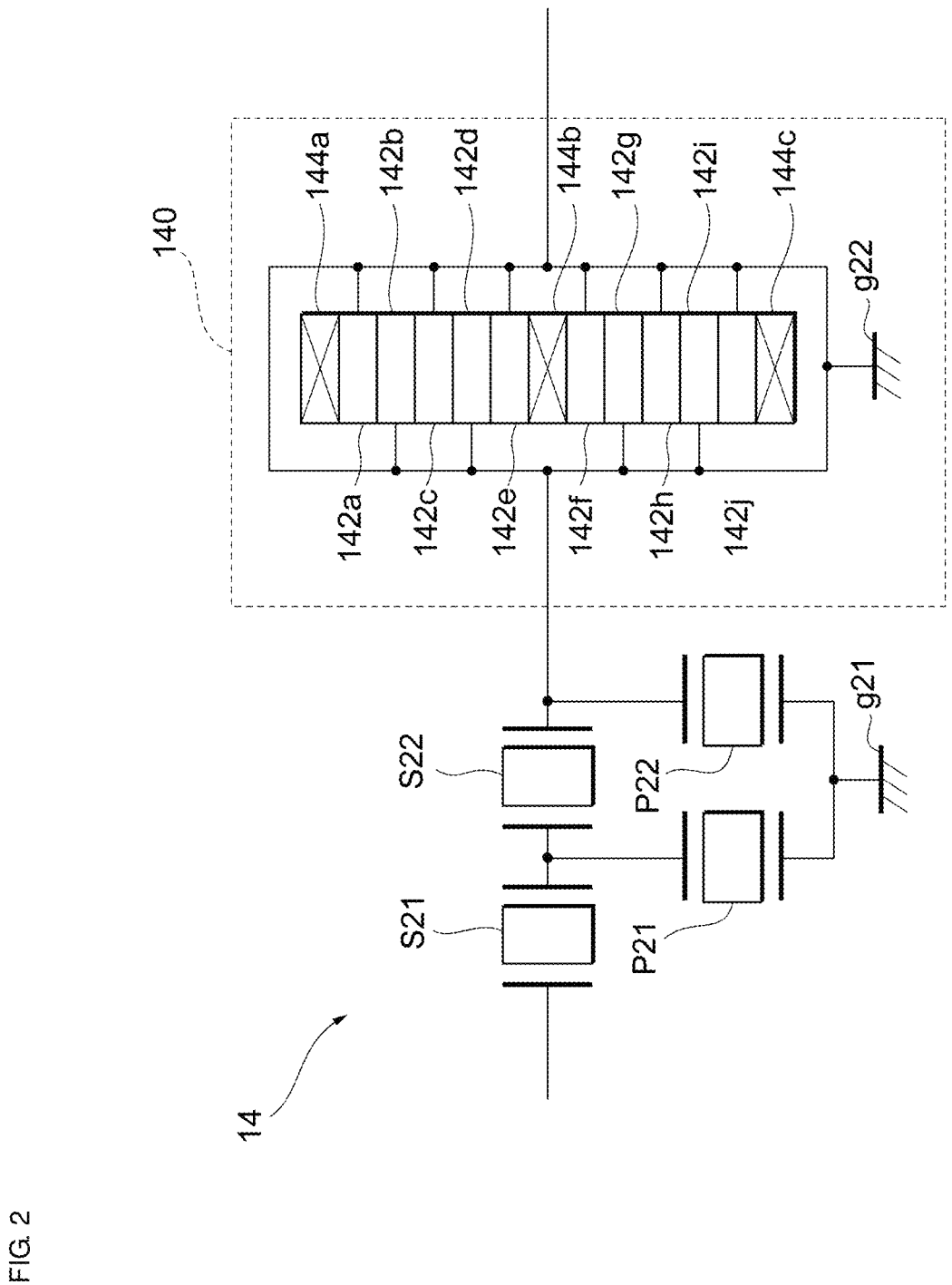
FIG. 2 is a circuit diagram of a receive filter circuit included in the filter device according to the first preferred embodiment of the present invention.

FIG. 1 is a circuit diagram of a filter device 1 according to a first preferred embodiment of the present invention. FIG. 2 is a circuit diagram of a receive filter circuit 14 included in the filter device 1 of the first preferred embodiment.

The filter device 1 includes a transmit input terminal Tx, a receive output terminal Rx, a first path 10, a second path 20, a second common terminal 30, and a first capacitor C1, for example.

The first path 10 connects the transmit input terminal Tx and the receive output terminal Rx and includes a transmit filter circuit 12 and a receive filter circuit 14.

A transmit signal output from a transmit circuit (not shown) is supplied to the transmit filter circuit 12 via the transmit input terminal Tx. The transmit filter circuit 12 allows a transmit signal of a predetermined frequency band to pass therethrough and to be output to a first common terminal 16, while it attenuates transmit signals of other frequency bands. The transmit signal passed through the transmit filter circuit 12 is sent to the second common terminal 30 via the first common terminal 16 and is further sent to a base station from the second common terminal 30.

A received signal received from a base station via the second common terminal 30 is supplied to the receive filter circuit 14 via the first common terminal 16. The receive filter circuit 14 allows a received signal of a predetermined frequency band to pass therethrough and attenuates received signals of other frequency bands. The received signal passed through the receive filter circuit 14 is sent to a receive circuit (not shown) via the receive output terminal Rx.

The filter device 1, which includes the transmit filter circuit 12 and the receive filter circuit 14 as described above, thus defines and functions as a duplexer.

The transmit filter circuit 12 in the first preferred embodiment is a ladder filter circuit including multiple resonators connected in series with each other and multiple resonators connected in parallel with each other. More specifically, the transmit filter circuit 12 includes four series arm resonators S11 through S14 disposed on a series arm and three parallel arm resonators P11 through P13 disposed on a parallel arm. The parallel arm resonators P11 and P12 are connected to a ground terminal g11, while the parallel arm resonator P13 is connected to a ground terminal g12. The path which connects the ground terminal g11 and the parallel arm resonator P11, which is closest to the transmit input terminal Tx among the parallel arm resonators P11 through P13, will be referred to as a third path 24.

The number of series arm resonators and the number of parallel arm resonators are not limited to the above-described numbers. Three or less or five or more series arm resonators may be provided. Two or less or four or more parallel arm resonators may be provided. Similarly, the numbers of various resonators in the second and third preferred embodiments are not limited to any particular numbers.

Each of the series arm resonators S11 through S14 and the parallel arm resonators P11 through P13 is not restricted to a particular type of device, and may preferably be a surface acoustic wave (SAW) filter, a piezoelectric thin-film resonator filter, or a bulk acoustic wave (BAW) filter, for example. The resonators in the second and third preferred embodiments may include at least one of the above-described device, for example.

The configuration of the receive filter circuit 14 will be described below with reference to FIG. 2. As shown in FIG. 2, the receive filter circuit 14 is a ladder filter circuit and includes two series arm resonators S21 and S22, two parallel arm resonators P21 and P22, and a longitudinally coupled resonator unit 140. The parallel arm resonators P21 and P22 are connected to a ground terminal g21.

The longitudinally coupled resonator unit 140 includes two 5-interdigital-transducer (5IDT) longitudinally coupled resonators and three reflectors 144a, 144b, and 144c. One 5IDT longitudinally coupled resonator includes five IDT electrodes 142a through 142e, while the other 5IDT longitudinally coupled resonator includes IDT electrodes 142f through 142j.

Referring to FIG. 1, the second path 20 will be explained. The second path 20 is connected in parallel with the transmit filter circuit 12 of the first path 10. More specifically, the second path 20 is connected to a node between the transmit input terminal Tx and the series arm resonator S11 and also to the first common terminal 16. The second path 20 includes a second capacitor C2, a 2IDT longitudinally coupled resonator 22, and a third capacitor C3 in this order in which they are located closer to the transmit input terminal Tx. The 2IDT longitudinally coupled resonator 22 is grounded.

The second path 20 generates a cancel signal having the same or substantially the same amplitude and the inverted phase with respect to an unwanted signal in the first path 10, and then combines this cancel signal with the signal in the first path 10. As a result, the unwanted signal in the first path 10 can be attenuated. The second and third capacitors C2 and C3 in the second path 20 have a function of adjusting the amplitude of a cancel signal.

The 2IDT longitudinally coupled resonator 22 includes two IDT electrodes and has a function of adjusting the phase of a signal input into the 2IDT longitudinally coupled resonator 22. In the 2IDT longitudinally coupled resonator 22, the IDT pitch (electrode finger pitch), the polarity of IDTs, and the IDT gap are set so that the phase of a standing wave excited in each IDT electrode deviates from that in another IDT electrode by about $\lambda/2$, for example. The 2IDT longitudinally coupled resonator 22 shifts the phase of an input signal by about $\lambda/2$ so as to generate an output signal whose phase is inverted with respect to the input signal and outputs the output signal. As a result, the second path 20 is able to generate a cancel signal whose phase is inverted with respect to an unwanted signal in the first path 10. The frequency band of a signal to be subjected to a phase shift in the 2IDT longitudinally coupled resonator 22 can be changed by adjusting the resonant frequency of the IDT electrodes, for example. The amount of phase shift "about $\lambda/2$" includes an allowance of the phase value which may change due to the manufacturing variations, for example.

The first capacitor C1 is connected to the second path 20 and the third path 24. More specifically, one end of the first capacitor C1 is connected to a node between the second capacitor C2 and the 2IDT longitudinally coupled resonator 22 on the second path 20, while the other end is connected to the third path 24. Inductance (not shown) is generated by wiring, for example, between the ground terminal g11 and a node between the third path 24 and the first capacitor C1.

1.2. Structure of Filter Device

Figure 3:
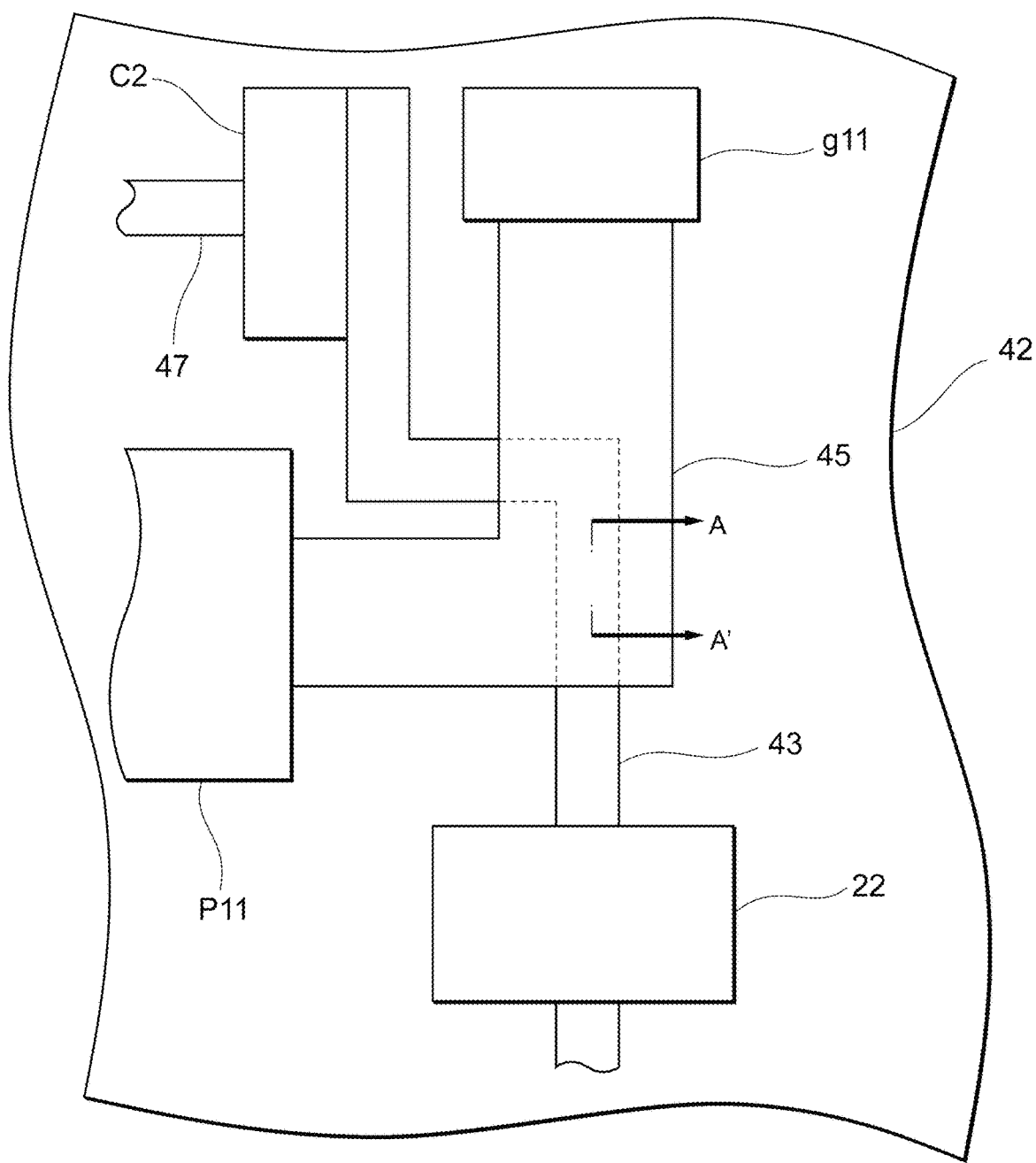
FIG. 3 is a top view partially illustrating the filter device according to the first preferred embodiment of the present invention.
Figure 4:
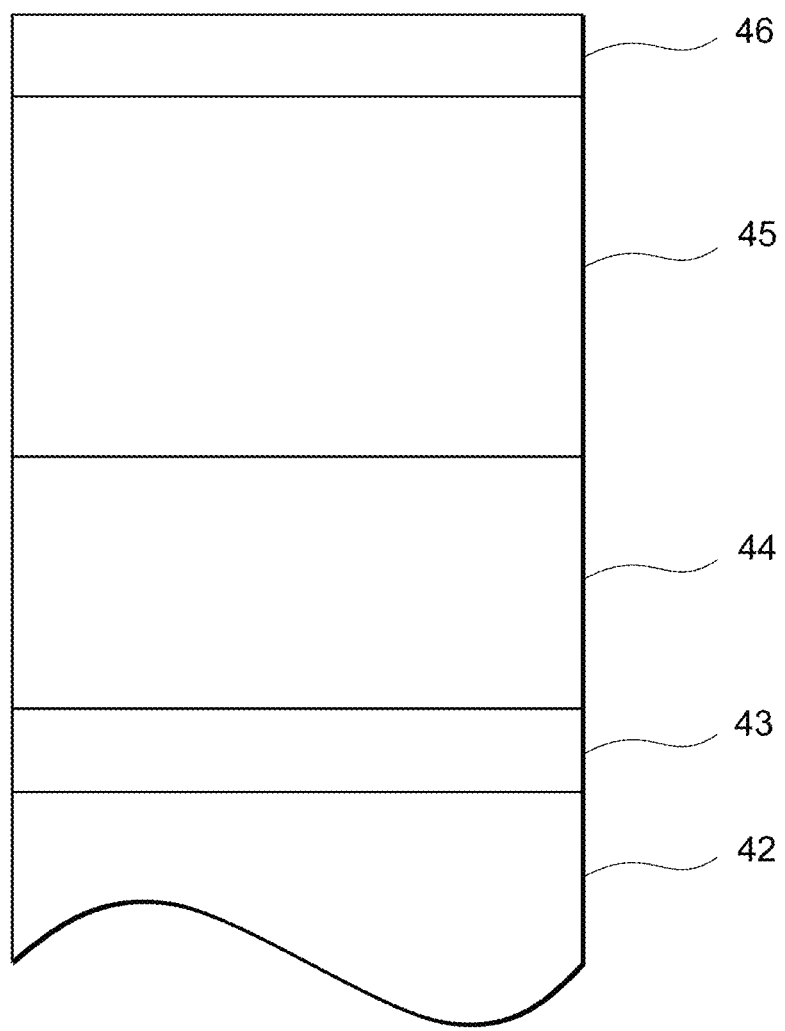
FIG. 4 is a sectional view taken along line A-A' in FIG. 3.

The structure of the filter device 1 according to the first preferred embodiment will be described below with reference to FIGS. 3 and 4. FIG. 3 is a top view partially illustrating the filter device 1. FIG. 4 is a sectional view taken along long dashed dotted line A-A' in FIG. 3.

The filter device 1 includes a piezoelectric substrate 42. If SAWs are utilized, the piezoelectric substrate 42 may preferably be made of a piezoelectric material, such as lithium tantalate ($LiTaO_3$) or lithium niobate ($LiNbO_3$), for example. If BAWs are utilized, the piezoelectric substrate 42 may preferably be made of a piezoelectric material, such as aluminum nitride (AlN), for example. The transmit filter circuit 12, the receive filter circuit 14, and the second path 20, for example, are provided on the piezoelectric substrate 42.

In FIG. 3, the parallel arm resonator P11 and the ground terminal g11 of the transmit filter circuit 12 and the 2IDT longitudinally coupled resonator 22 and the second capacitor C2 of the second path 20 are shown. The 2IDT longitudinally coupled resonator 22 and the second capacitor C2 are connected with each other by a first wiring 43. The first wiring 43 defines a portion of the second path 20. The parallel arm resonator P11 and the ground terminal g11 are connected with each other by a second wiring 45. The second wiring 45 defines a portion of the third path 24. The portion of the first wiring 43 indicated by the broken lines in FIG. 3 passes between the piezoelectric substrate 42 and the second wiring 45. That is, the first wiring 43 and the second wiring 45 three-dimensionally intersect with each other.

FIG. 4 is a sectional view taken along long dashed dotted line A-A' in FIG. 3. As shown in FIG. 4, five layers are provided in the sectional view of the filter device 1. More specifically, the piezoelectric substrate 42, the first wiring 43, an intermediate layer 44, the second wiring 45, and a surface layer 46 are provided from the bottom in this order.

The intermediate layer 44 is disposed in a space sandwiched between the first wiring 43 and the second wiring 45. The intermediate layer 44 is defined by an insulator, and may preferably be a ceramic layer made of a ceramic material, for example. The ceramic layer may preferably be a glass layer made of $SiO_2$, for example. The surface layer 46 may preferably be made of SiN, for example. The surface layer 46 is provided on the second wiring 45 so as to protect the surface of the second wiring 45.

In the first preferred embodiment, as a result of the first wiring 43 and the second wiring 45 opposing each other, the first capacitor C1 is provided. The capacitance of the first capacitor C1 can be adjusted by suitably changing the area by which the first wiring 43 and the second wiring 45 oppose each other, the distance between the first wiring 43 and the second wiring 45, and the material or the shape of the intermediate layer 44, for example. Changing the capacitance of the first capacitor C1 can adjust the amplitude and the phase of a cancel signal generated in the second path 20. That is, the first capacitor C1 is one of the parameters for adjusting a cancel signal. As a result of adjusting the capacitance of the first capacitor C1, a suitable cancel signal can be generated without changing (increasing, for example) the capacitance of the second capacitor C2.

1.3. Advantages

Figure 5:
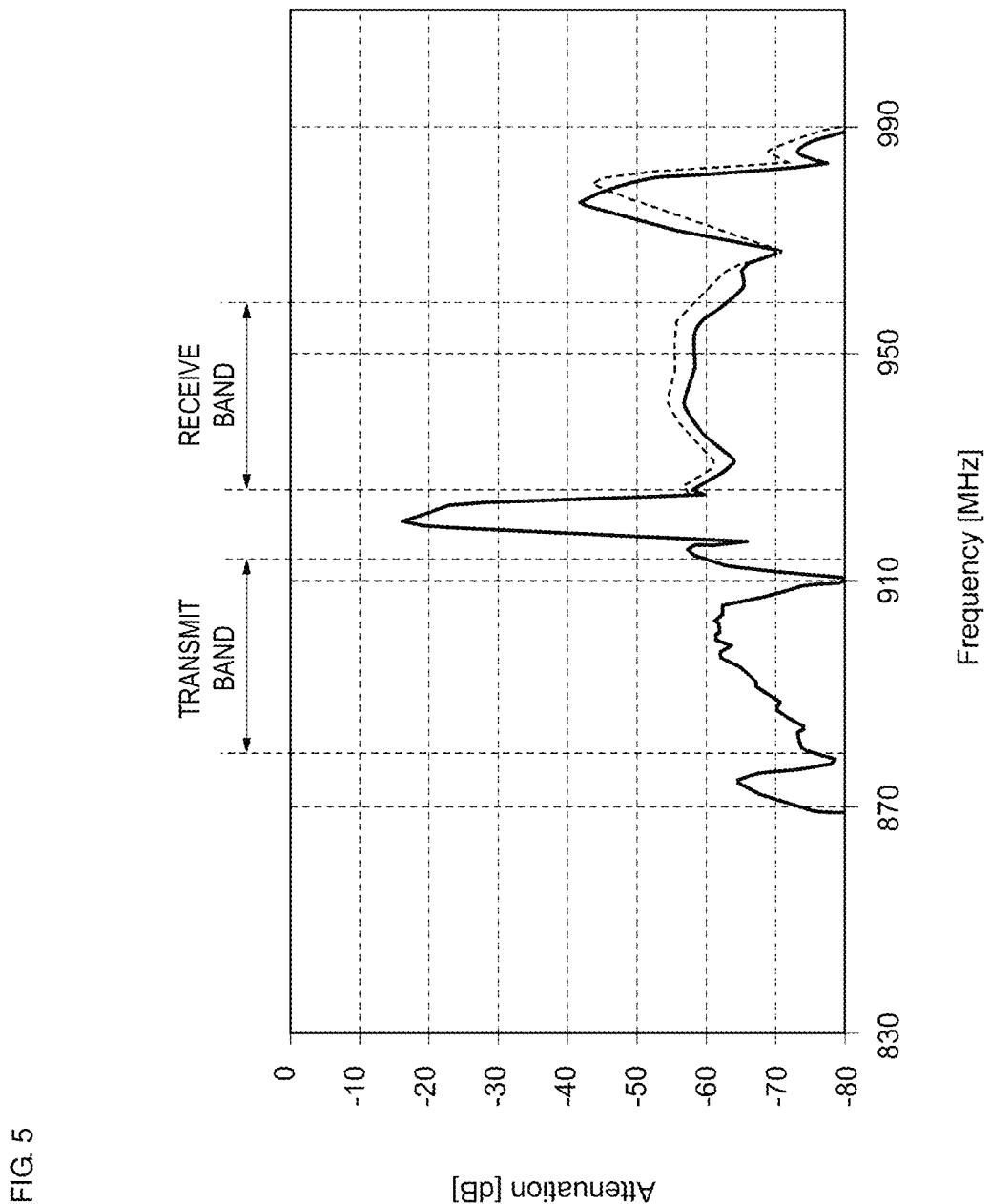
FIG. 5 is a graph illustrating the isolation characteristics of the filter device according to the first preferred embodiment of the present invention in a path from a transmit input terminal to a receive output terminal.
Figure 6:
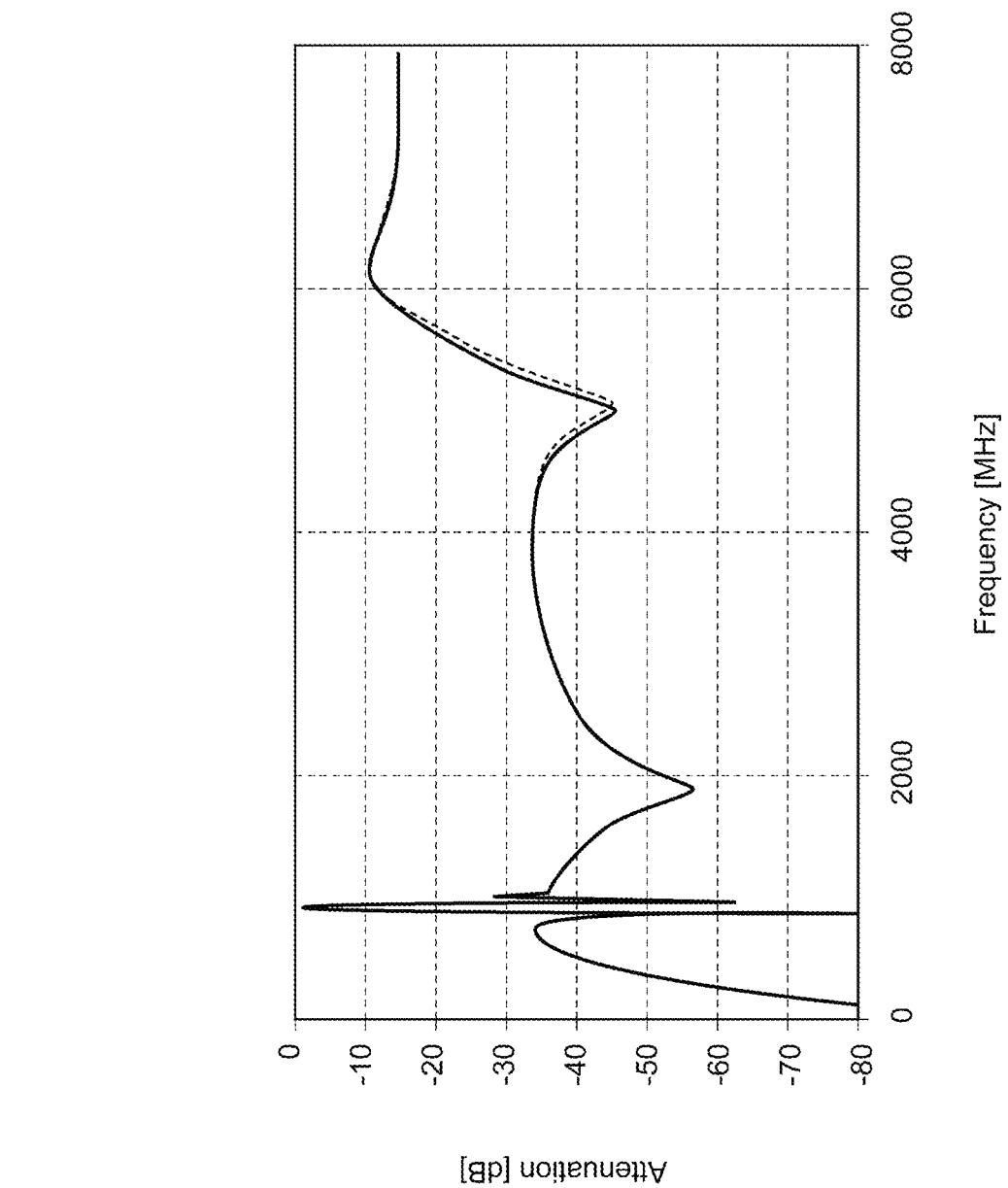
FIG. 6 is a graph illustrating the attenuation characteristics of the filter device according to the first preferred embodiment of the present invention in a path from the transmit input terminal to a second common terminal.

Advantages of the filter device 1 according to the first preferred embodiment will be discussed below with reference to FIGS. 5 and 6. FIG. 5 is a graph illustrating the transmission characteristics (also called the isolation characteristics) of the filter device 1 in a path from the transmit input terminal Tx to the receive output terminal Rx. FIG. 6 is a graph illustrating the attenuation characteristics of the filter device 1 in a path from the transmit input terminal Tx to the second common terminal 30.

In FIG. 5, the transmit band is the pass band of the transmit filter circuit 12, while the receive band is the pass band of the receive filter circuit 14. In FIG. 5, the solid line indicates the isolation characteristics of the filter device 1 according to the first preferred embodiment, while the broken line indicates the isolation characteristics of a filter device according to a comparative example not including the first capacitor C1.

As shown in FIG. 5, the attenuation in the receive band of the filter device 1 of the first preferred embodiment is greater than that of the filter device of the comparative example. That is, the attenuation in the receive band of the transmit filter circuit 12 is increased. The reason for this is as follows. As a result of adding the first capacitor C1, more parameters are provided to generate a cancel signal. This facilitates the generation of a cancel signal having the same or substantially the same amplitude and the inverted phase with respect to an unwanted signal, compared with when the first capacitor C1 is not provided. Thus, a signal input into the transmit filter circuit 12 is less likely to leak into the receive filter circuit 14 and to mix with a signal in the receive band. As a result, the reception sensitivity is less likely to be degraded.

In the transmit filter circuit 12, typically, a radio-frequency signal is attenuated by an attenuation pole generated by sub-resonance provided in a radio-frequency band of about several gigahertz. Sub-resonance is series LC resonance generated by the capacitance of a parallel capacitor in the equivalent circuit of a SAW resonator and the inductance of an external inductor connected to the SAW resonator. In this example, the attenuation pole generated by sub-resonance is provided by the capacitance of the parallel arm resonators P11 through P13 and the inductance produced by the wiring which connect the parallel arm resonators P11 and P12 and the ground terminal g11 and the parallel arm resonator P13 and the ground terminal g12. More specifically, for example, the attenuation pole is generated by series LC resonance provided by the capacitance of the parallel arm resonator P11 and the inductance of the wiring which connects the parallel arm resonator P11 and the ground terminal g11. Without the first capacitor C1, in order to shift this attenuation pole to the lower frequency side, it is necessary to increase the capacitance of the parallel arm resonator P11 or the above-described inductance. To increase the capacitance or the inductance, it is necessary to increase the size of the parallel arm resonator or to increase the inductance provided in or on an inner layer of a package of the filter device. This makes it difficult to reduce the size of the filter device.

In FIG. 6, the solid line indicates the attenuation characteristics of the filter device 1 according to the first preferred embodiment, while the broken line indicates the attenuation characteristics of the filter device of the comparative example not including the first capacitor C1. As shown in FIG. 6, the attenuation pole in the filter device 1 of the first preferred embodiment is positioned at the lower frequency side than that of the comparative example. That is, as a result of providing the first capacitor C1, the attenuation pole generated by the above-described series LC resonance is shifted to the lower frequency side.

In this manner, in the first preferred embodiment, the attenuation pole generated by sub-resonance provided in a radio-frequency band can be adjusted without increasing the size of the parallel arm resonator or increasing the inductance. That is, in the first preferred embodiment, it is possible to shift the attenuation pole to the lower frequency side without increasing the size of the filter device 1.

2. Second Preferred Embodiment

Figure 8:
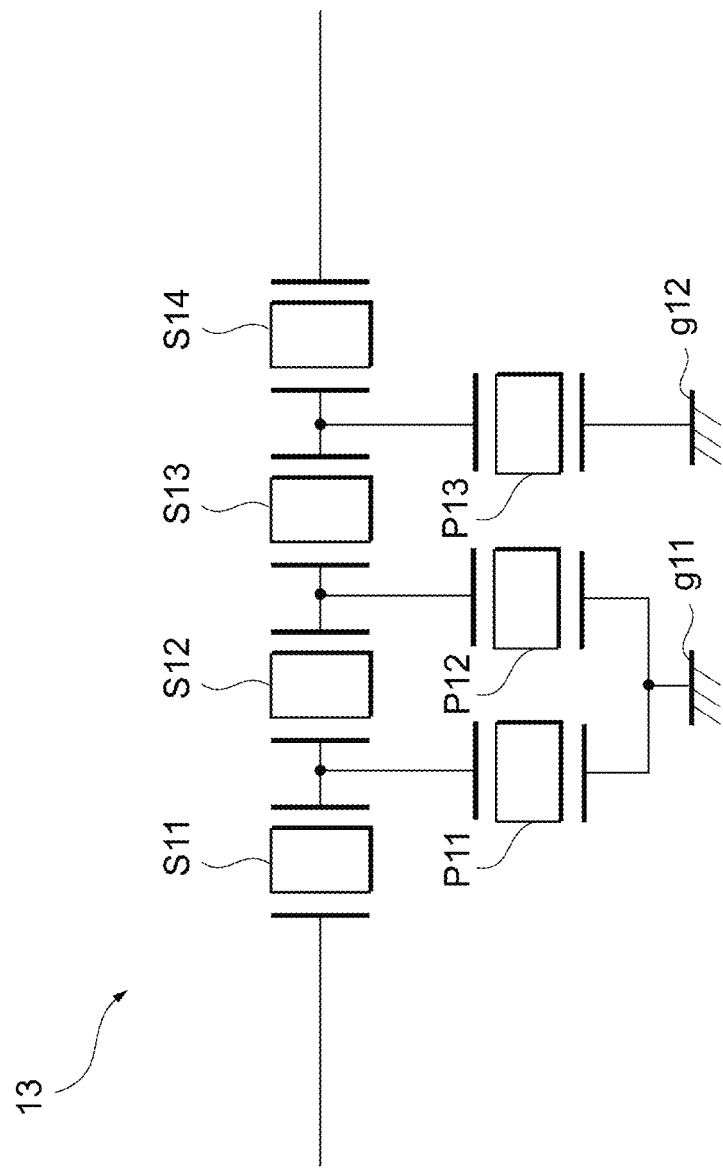
FIG. 8 is a circuit diagram of a transmit filter circuit included in the filter device according to the second preferred embodiment of the present invention.
Figure 9:
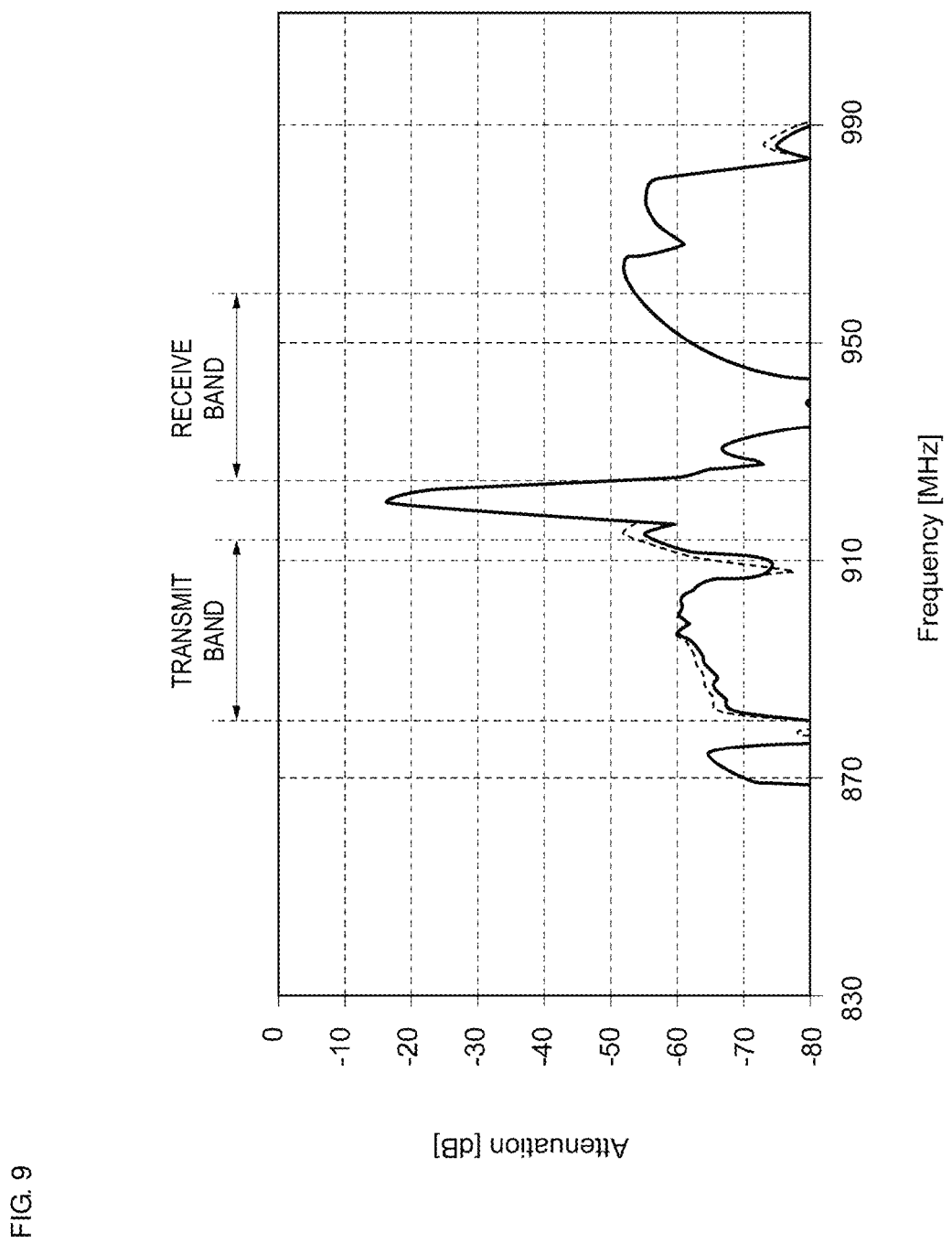
FIG. 9 is a graph illustrating the isolation characteristics of the filter device according to the second preferred embodiment of the present invention.

A second preferred embodiment of the present invention will be described below with reference to FIGS. 7, 8, and 9. The second preferred embodiment will be discussed mainly by referring to points different from the first preferred embodiment while omitting the same or similar points as the first preferred embodiment.

2.1. Circuit Diagram of Filter Device

Figure 7:
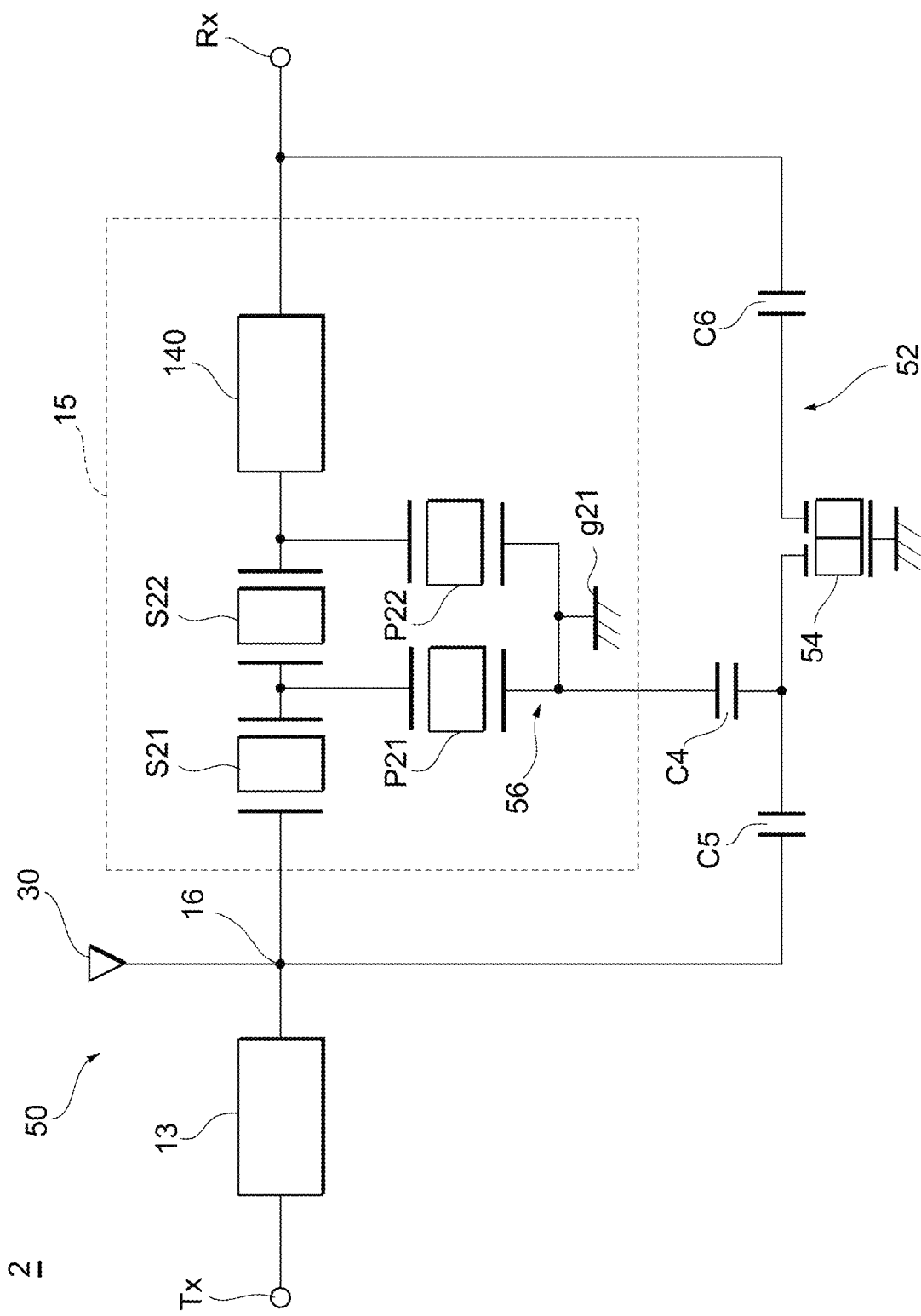
FIG. 7 is a circuit diagram of a filter device according to a second preferred embodiment of the present invention.

FIG. 7 is a circuit diagram of a filter device 2 according to the second preferred embodiment. FIG. 8 is a circuit diagram of a transmit filter circuit 13 included in the filter device 2 of the second preferred embodiment. FIG. 9 is a graph illustrating the isolation characteristics of the filter device 2.

The configuration of the filter device 2 will first be described below with reference to FIGS. 7 and 8. As shown in FIG. 7, the filter device 2 includes a transmit input terminal Tx, a receive output terminal Rx, a first path 50, a second path 52, a second common terminal 30, and a fourth capacitor C4.

The first path 50 connects the transmit input terminal Tx and the receive output terminal Rx and includes the transmit filter circuit 13 and a receive filter circuit 15. As shown in FIG. 8, the transmit filter circuit 13 includes four series arm resonators S11 through S14, three parallel arm resonators P11 through P13, and two ground terminals g11 and g12, as in the transmit filter circuit 12 of the first preferred embodiment. The transmit filter circuit 13 in the second preferred embodiment is different from the transmit filter circuit 12 in the first preferred embodiment in that the parallel arm resonator P11 located closest to the transmit input terminal Tx among the parallel arm resonators P11 through P13 is not connected to the second path 52 via a capacitor.

Referring to FIG. 7, the configuration of the filter device 2 will be described. The receive filter circuit 15 includes two series arm resonators S21 and S22, two parallel arm resonators P21 and P22, and a longitudinally coupled resonator unit 140, as in the receive filter circuit 14 of the first preferred embodiment. The receive filter circuit 15 in the second preferred embodiment is different from the receive filter circuit 14 in the first preferred embodiment in that the other end of the fourth capacitor C4 is connected to a third path 56 which connects the parallel arm resonator P21 and the ground terminal g21. One end of the fourth capacitor C4 is connected to the second path 52, as described below.

The second path 52 is connected in parallel with the receive filter circuit 15 of the first path 50. The second path 52 includes a fifth capacitor C5, a 2IDT longitudinally coupled resonator 54, and a sixth capacitor C6 in this order in which they are located closer to the first common terminal 16. The 2IDT longitudinally coupled resonator 54 is grounded. The left-side IDT electrode of the 2IDT longitudinally coupled resonator 54 is connected to the fifth capacitor C5, while the right-side IDT electrode is connected to the sixth capacitor C6. One end of the fourth capacitor C4 is connected to a path which connects the fifth capacitor C5 and the left-side IDT electrode of the 2IDT longitudinally coupled resonator 54. The other end of the fourth capacitor C4 is connected to the third path 56, as described above.

The fourth capacitor C4 may be provided in any suitable manner. For example, the fourth capacitor C4 may be provided as a result of the third path 56 opposing the path which connects the fifth capacitor C5 and the 2IDT longitudinally coupled resonator 54.

2.2. Advantages

The isolation characteristics of the filter device 2 according to the second preferred embodiment will be discussed below with reference to FIG. 9. In FIG. 9, the solid line indicates the isolation characteristics of the filter device 2 according to the second preferred embodiment, while the broken line indicates the isolation characteristics of a filter device according to a comparative example not including the fourth capacitor C4. As shown in FIG. 9, the attenuation in the transmit band of the filter device 2 of the second preferred embodiment is greater than that of the filter device of the comparative example. That is, the attenuation within the transmit band in the receive filter circuit 15 is increased due to the fourth capacitor C4. The reason for this is as follows. By including the fourth capacitor C4, more parameters are provided to generate a cancel signal in the second path 52. This facilitates the generation of a cancel signal having the same or substantially the same amplitude and the inverted phase with respect to an unwanted signal.

As well as in the first preferred embodiment, in the second preferred embodiment, it is possible to shift the attenuation pole generated by sub-resonance provided in a radio-frequency band to the lower frequency side without increasing the size of the filter device 2.

3. Third Preferred Embodiment

3.1. Circuit Diagram of Filter Device

Figure 10:
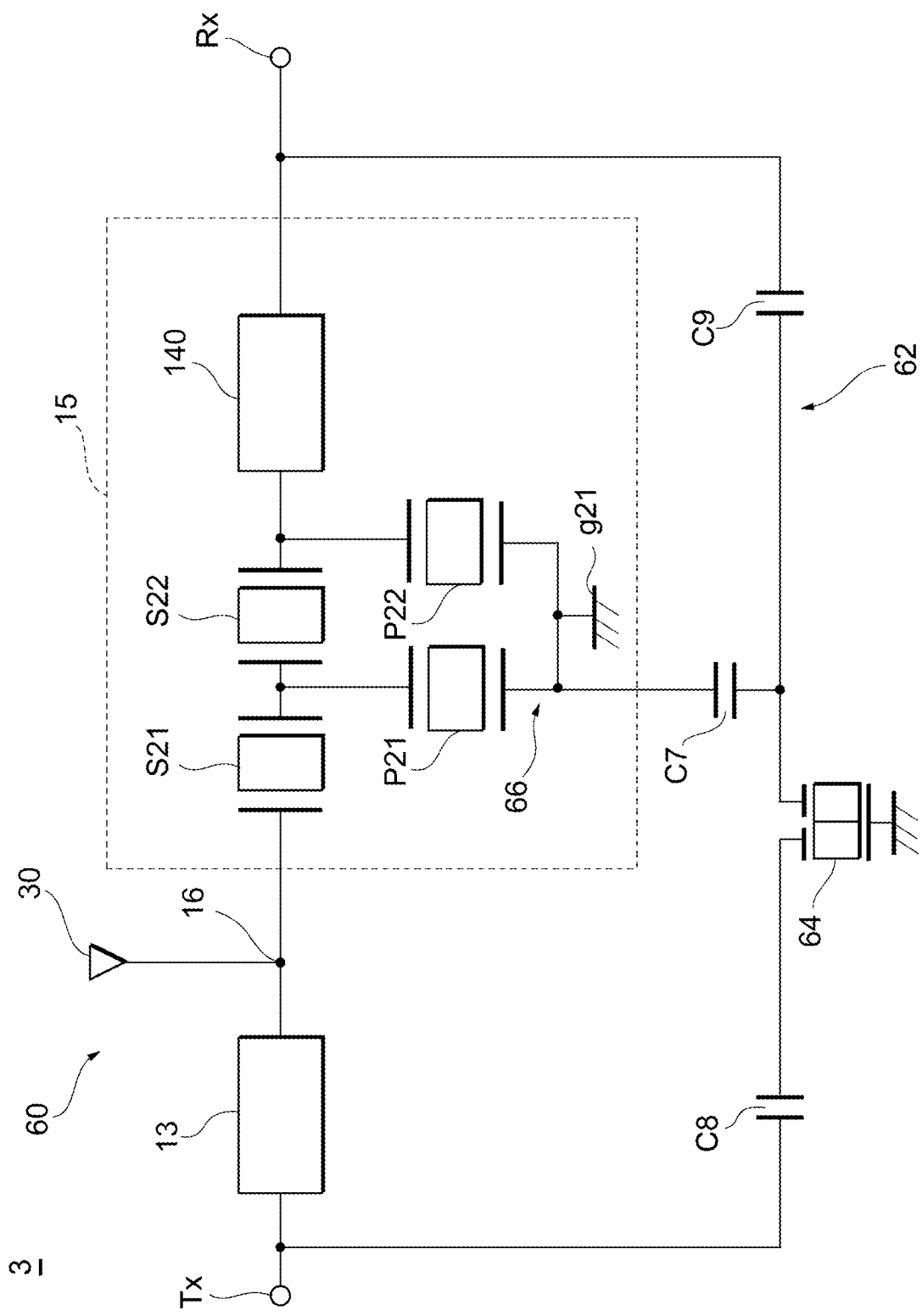
FIG. 10 is a circuit diagram of a filter device according to a third preferred embodiment of the present invention.
Figure 11:
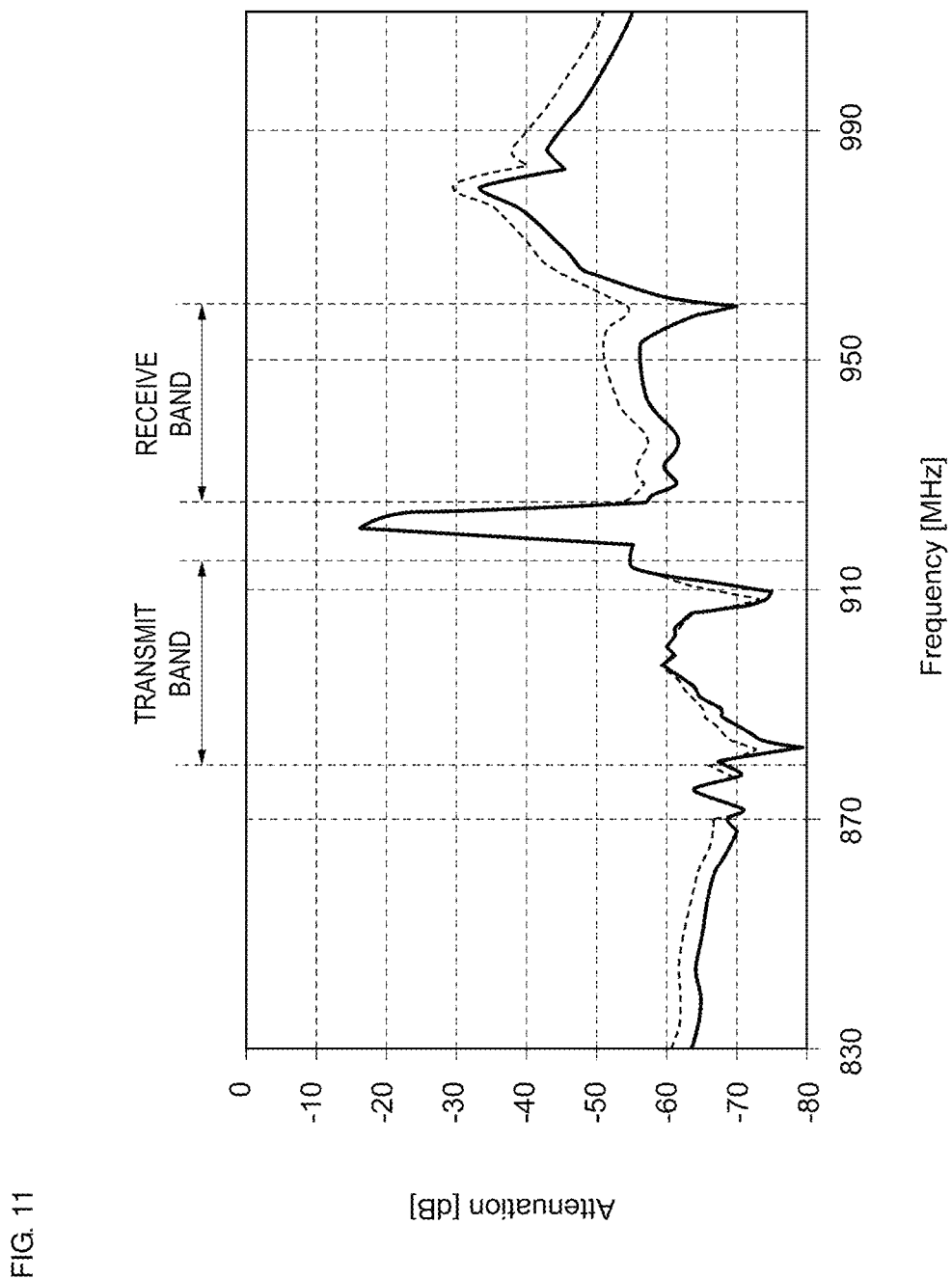
FIG. 11 is a graph illustrating the isolation characteristics of the filter device according to the third preferred embodiment of the present invention.

A third preferred embodiment of the present invention will be described below with reference to FIGS. 10 and 11. FIG. 10 is a circuit diagram of a filter device 3 according to the third preferred embodiment. FIG. 11 is a graph illustrating the isolation characteristics of the filter device 3.

The filter device 3 of the third preferred embodiment is different from the filter device 2 of the second preferred embodiment in that a second path 62 is connected in parallel with the transmit filter circuit 13 and the receive filter circuit 15 in a first path 60. More specifically, the second path 62 is connected to a node between the transmit input terminal Tx and the transmit filter circuit 13 and a node between the receive output terminal Rx and the longitudinally coupled resonator unit 140 of the receive filter circuit 15. The second path 62 includes an eighth capacitor C8, a 2IDT longitudinally coupled resonator 64, and a ninth capacitor C9 in this order in which they are located closer to the transmit input terminal Tx. The 2IDT longitudinally coupled resonator 64 is grounded. The left-side IDT electrode of the 2IDT longitudinally coupled resonator 64 is connected to the eighth capacitor C8, while the right-side IDT electrode is connected to the ninth capacitor C9. One end of a seventh capacitor C7 is connected to a path which connects the ninth capacitor C9 and the right-side IDT electrode of the 2IDT longitudinally coupled resonator 64. The other end of the seventh capacitor C7 is connected to a third path 66 which connects the parallel arm resonator P21 of the receive filter circuit 15 and the ground terminal g21.

3.2. Advantages

The isolation characteristics of the filter device 3 according to the third preferred embodiment will be discussed below with reference to FIG. 11. In FIG. 11, the solid line indicates the isolation characteristics of the filter device 3 according to the third preferred embodiment, while the broken line indicates the isolation characteristics of a filter device according to a comparative example not including the seventh capacitor C7. As shown in FIG. 11, the attenuation in the transmit band and that in the receive band of the filter device 3 of the third preferred embodiment are greater than those of the comparative example. That is, the attenuation within the transmit band in the receive filter circuit 15 and that within the receive band in the transmit filter circuit 13 are increased. The reason for this is as follows. As a result of including the seventh capacitor C7, more parameters are provided to generate a cancel signal. This facilitates the generation of a cancel signal in the second path 62.

As well as in the first preferred embodiment, in the third preferred embodiment, it is possible to shift the attenuation pole generated by sub-resonance formed in a radio-frequency band to the lower frequency side without increasing the size of the filter device 3.

4.1. Modified Examples

Figure 12:
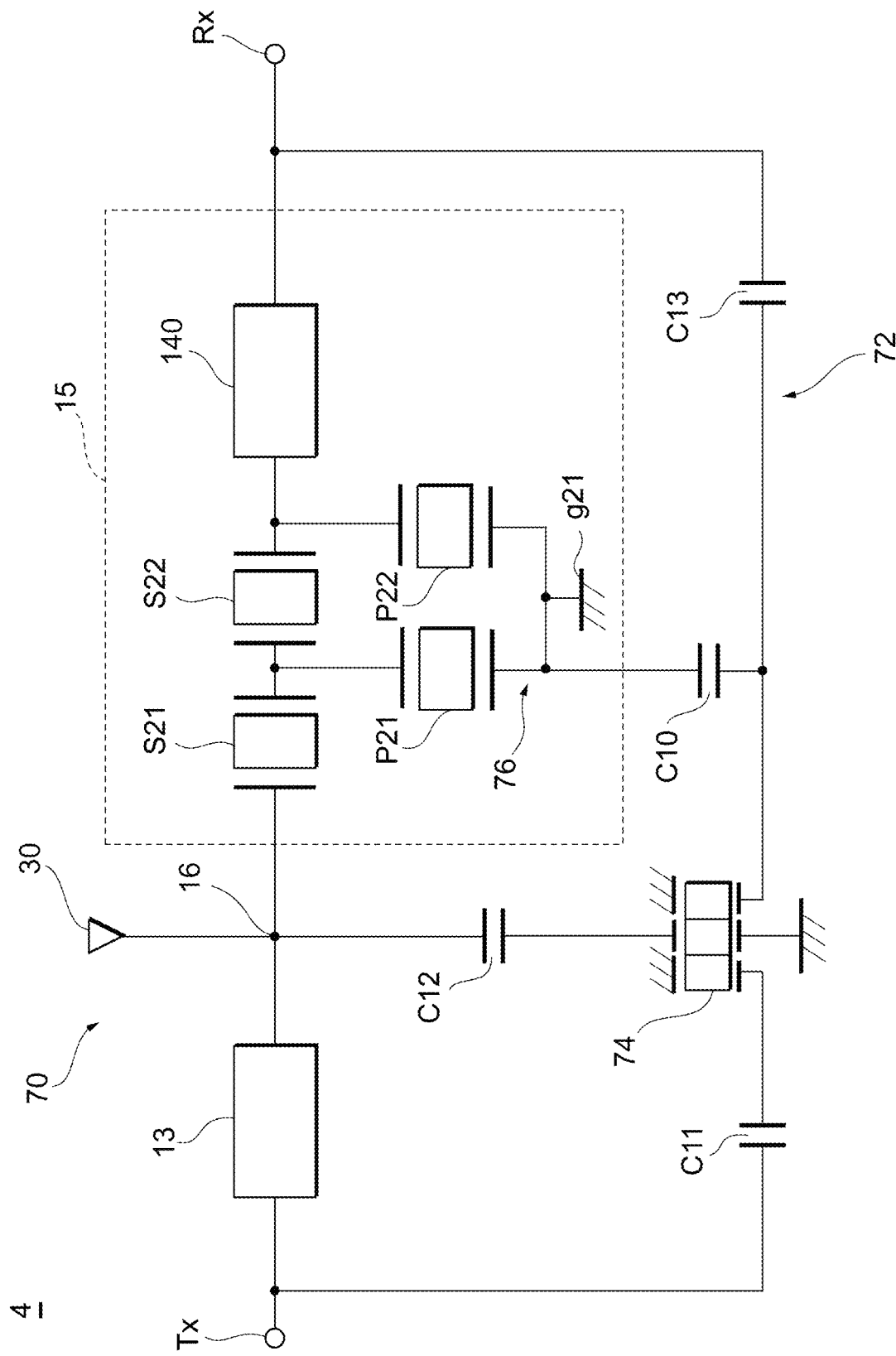
FIG. 12 is a circuit diagram of a filter device according to a first modified example of a preferred embodiment of the present invention.
Figure 13:
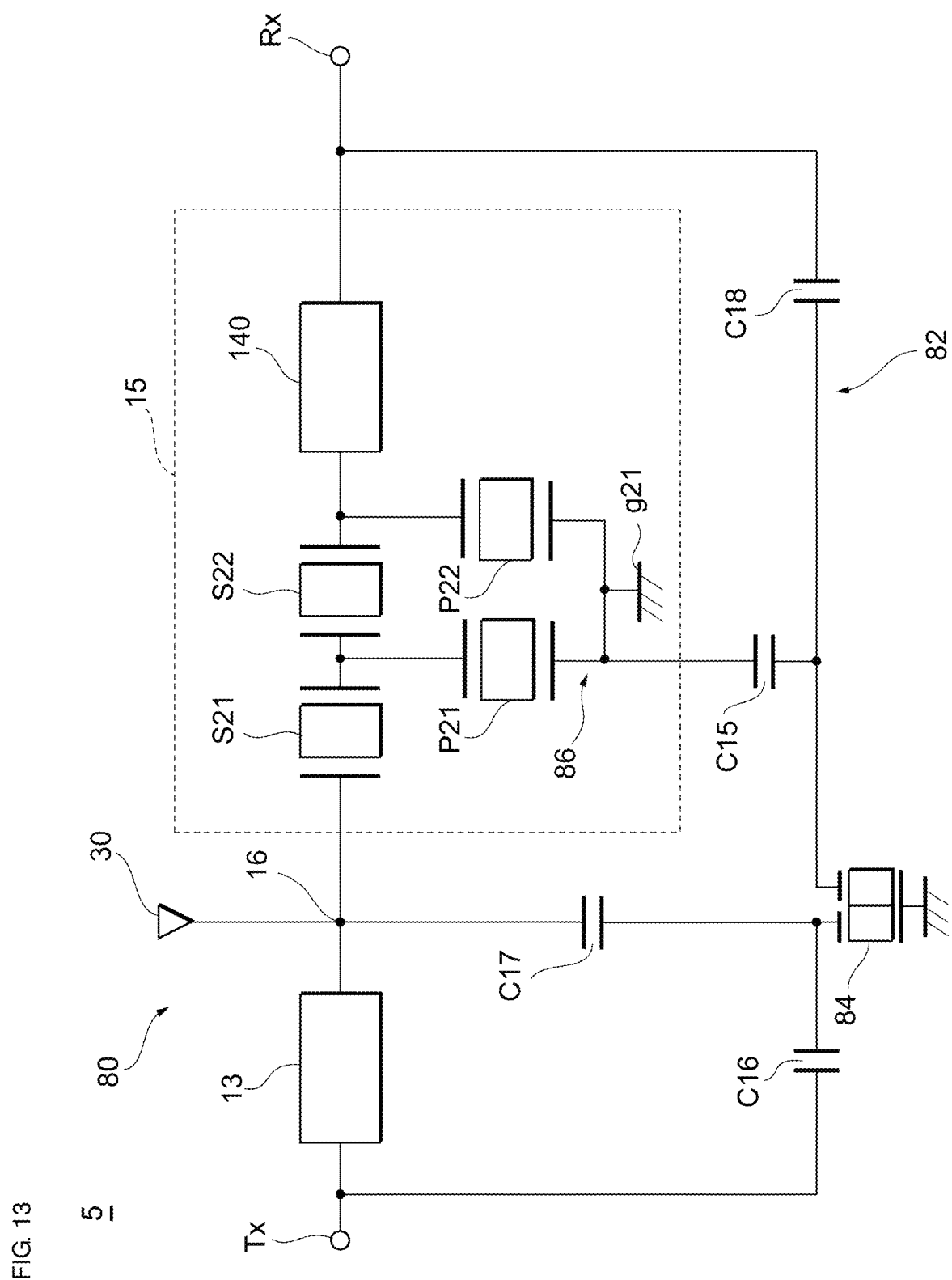
FIG. 13 is a circuit diagram of a filter device according to a second modified example of a preferred embodiment of the present invention.

Modified examples of the above-described filter devices will be described below with reference to FIGS. 12 and 13. FIG. 12 is a circuit diagram of a filter device 4 according to a first modified example of a preferred embodiment of the present invention. FIG. 13 is a circuit diagram of a filter device 5 according to a second modified example of a preferred embodiment of the present invention. The filter devices 4 and 5 of the first and second modified examples are different from the filter device 3 of the third preferred embodiment in that the configuration of the second path 62 is different.

4.1. Circuit Diagram of Filter Device of First Modified Example

As shown in FIG. 12, in the filter device 4 of the first modified example, a second path 72 is connected in parallel with the transmit filter circuit 13 and the receive filter circuit 15 in a first path 70. More specifically, the second path 72 is connected to a node between the transmit input terminal Tx and the transmit filter circuit 13, the first common terminal 16, and a node between the receive output terminal Rx and the longitudinally coupled resonator unit 140 of the receive filter circuit 15. In this manner, the second path 72 is connected to the first path 70 at three nodes. The second path 72 includes an eleventh capacitor C11, a twelfth capacitor C12, a thirteenth capacitor C13, and a 3IDT longitudinally coupled resonator 74. The eleventh capacitor C11 is connected to a node between the transmit input terminal Tx and the transmit filter circuit 13. The twelfth capacitor C12 is connected to the first common terminal 16. The thirteenth capacitor C13 is connected to a node between the receive output terminal Rx and the longitudinally coupled resonator unit 140 of the receive filter circuit 15. The 3IDT longitudinally coupled resonator 74 is connected to the eleventh, twelfth, and thirteenth capacitors C11, C12, and C13.

The 3IDT longitudinally coupled resonator 74 includes three IDT electrodes. The three IDT electrodes are connected to different ground terminals. The left-side IDT electrode is connected to the eleventh capacitor C11, the middle-side IDT electrode is connected to the twelfth capacitor C12, and the right-side IDT electrode is connected to the thirteenth capacitor C13.

The filter device 4 includes a tenth capacitor C10. One end of the tenth capacitor C10 is connected to the second path 72, while the other end of the tenth capacitor C10 is connected to a third path 76 which connects the parallel arm resonator P21 and the ground terminal g21. More specifically, one end of the tenth capacitor C10 is connected to a node between the thirteenth capacitor C13 and the right-side IDT electrode of the 3IDT longitudinally coupled resonator 74, while the other end of the tenth capacitor 10 is connected to the third path 76.

4.2. Circuit Diagram of Filter Device of Second Modified Example

As shown in FIG. 13, as in the first modified example, in the filter device 5 of the second modified example, a second path 82 is connected to a first path 80 at a node between the transmit input terminal Tx and the transmit filter circuit 13, the first common terminal 16, and a node between the receive output terminal Rx and the longitudinally coupled resonator unit 140 of the receive filter circuit 15. The second path 82 includes a sixteenth capacitor C16, a seventeenth capacitor C17, an eighteenth capacitor C18, and a 2IDT longitudinally coupled resonator 84. The sixteenth capacitor C16 is connected to a node between the transmit input terminal Tx and the transmit filter circuit 13. The seventeenth capacitor C17 is connected to the first common terminal 16. The eighteenth capacitor C18 is connected to a node between the receive output terminal Rx and the longitudinally coupled resonator unit 140 of the receive filter circuit 15. The 2IDT longitudinally coupled resonator 84 is connected to the sixteenth, seventeenth, and eighteenth capacitors C16, C17, and C18.

The 2IDT longitudinally coupled resonator 84 includes two IDT electrodes. The left-side IDT electrode is connected to the sixteenth and seventeenth capacitors C16 and C17, while the right-side IDT electrode is connected to the eighteenth capacitor C18.

The filter device 5 includes a fifteenth capacitor C15. One end of the fifteenth capacitor C15 is connected to the second path 82, while the other end of the fifteenth capacitor C15 is connected to a third path 86 which connects the parallel arm resonator P21 and the ground terminal g21. More specifically, one end of the fifteenth capacitor C15 is connected a node between the eighteenth capacitor C18 and the right-side IDT electrode of the 2IDT longitudinally coupled resonator 84, while the other end of the fifteenth capacitor C15 is connected to the third path 86.

4.3. Advantages

As in the filter device 3 according to the third preferred embodiment, in the filter devices 4 and 5 according to the first and second modified examples, the attenuation within the transmit band in the receive filter circuit 15 and that within the receive band in the transmit filter circuit 13 are increased. As well as in the first preferred embodiment, in the first and second modified examples, it is possible to shift the attenuation pole generated by sub-resonance formed in a radio-frequency band to the lower frequency side without increasing the sizes of the filter devices 4 and 5.

The above-described preferred embodiments are provided to facilitate the understanding of the present invention, but are not intended to be exhaustive or to limit the present invention to the precise structure and configurations disclosed. The elements of the preferred embodiments and the positions, materials, conditions, configurations, and sizes thereof are not restricted to those described in the preferred embodiments and may be changed in an appropriate manner. The elements of the different preferred embodiments may be partially replaced by or combined with each other.

For example, although the second path is connected to the first path at two or three nodes in the above-described preferred embodiments, it may be connected to the first path at four or more nodes.

In the above-described preferred embodiments, the capacitor connected to the second and third paths is provided therebetween as a result of the second and third paths opposing each other. However, a different approach may be taken to provide such a capacitor. For example, in the first preferred embodiment, the first capacitor C1 may be provided as a result of the second path 20 and the parallel arm resonator P11 opposing each other. More specifically, the first capacitor C1 may be provided as a result of the second path 20 and a comb-shaped electrode or a busbar (neither of them is shown) of the parallel arm resonator P11 opposing each other. The busbar opposing the second path 20 may be a busbar connected to the ground terminal g11. Similarly, the fourth capacitor C4, the seventh capacitor C7, the tenth capacitor C10, and the fifteenth capacitor C15 may be provided in a manner other than those described in the corresponding preferred embodiments.

The capacitor connected between the second and third paths may be connected to any one of the parallel arm resonators of the transmit filter circuit or the receive filter circuit. For example, in the first preferred embodiment, the first capacitor C1 is connected to the third path 24 connecting the parallel arm resonator P11 and the ground terminal g11. However, instead of to the third path 24, the first capacitor C1 may be connected to the path which connects the parallel arm resonator P12 and the ground terminal g11 or the path which connects the parallel arm resonator P13 and the ground terminal g12.

Although the grounded resonator disposed on the second path is a 2IDT or 3IDT longitudinally coupled resonator in the above-described preferred embodiments, it may be a longitudinally coupled resonator including four or more IDT electrodes. In accordance with the number of IDT electrodes of the longitudinally coupled resonator, the number of nodes on the first path that the second path is connected can be determined.

In the above-described preferred embodiments, each of the filter devices is applied to a duplexer. However, a filter device according to a preferred embodiment of the present invention may be applicable to various filter devices including the corresponding number of filter circuits. For example, the filter device may include a single filter circuit. The filter device may be a duplexer including a composite of two filter circuits, as explained in the above-described preferred embodiments, a triplexer including a composite of three filter circuits, a quadplexer including a composite of four filter circuits, and an octaplexer including a composite of eight filter circuits.

In the first preferred embodiment, the ceramic layer is disposed as the intermediate layer 44 between the first wiring 43 and the second wiring 45. However, the ceramic layer may be omitted.

In the above-described preferred embodiments, the resonator disposed on the second path is a longitudinally coupled resonator. However, the resonator disposed on the second path may be another type of resonator, such as a resonator used as a parallel arm resonator in the above-described preferred embodiments.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device comprising:
   a first path including at least one ladder filter circuit and connecting a first terminal and a second terminal, the at least one ladder filter circuit including a parallel arm resonator connected to a ground terminal;
   a second path including a grounded resonator; and
   a capacitor; wherein
   the second path is connected in parallel with any of the at least one ladder filter circuit such that a first end of the second path is connected at a first portion of the at least one ladder filter circuit on the first path and a second end of the second path is connected at a second portion of the at least one ladder filter circuit on the first path; and
   one end of the capacitor is connected to the second path, and another end of the capacitor is connected to a third path which connects the parallel arm resonator and the ground terminal.

2. The filter device according to claim 1, wherein the grounded resonator is a longitudinally coupled resonator.

3. The filter device according to claim 1, wherein the capacitor is defined by the second path and the third path opposing each other.

4. The filter device according to claim 3, wherein a ceramic layer is disposed in at least a portion of a space sandwiched between the second path and the third path where the capacitor is provided.

5. The filter device according to claim 1, wherein the first path includes a transmit filter circuit and a receive filter circuit, the transmit filter circuit being one of the at least one ladder filter circuit to transmit a signal, the receive filter circuit being another one of the at least one ladder filter circuit to receive a signal.

6. The filter device according to claim 5, wherein the second path is connected in parallel with the transmit filter circuit and the receive filter circuit.

7. The filter device according to claim 5, wherein the transmit filter circuit includes four series arm resonators disposed on a series arm and three parallel arm resonators disposed on a parallel arm.

8. The filter device according to claim 7, wherein the series arm resonators and the parallel arm resonators define surface acoustic wave filters.

9. The filter device according to claim 5, wherein the receive filter includes two series arm resonators, two parallel arm resonators, and a longitudinally coupled resonator unit.

10. The filter device according to claim 9, wherein the longitudinally coupled resonator unit includes two 5-inter-digital-transducer longitudinally coupled resonators and three reflectors.

11. The filter device according to claim 1, further comprising a piezoelectric substrate on which the at least one ladder filter circuit and the second path are provided.

12. A filter device comprising:
    a first path including at least one ladder filter circuit and connecting a first terminal and a second terminal, the at least one ladder filter circuit including a parallel arm resonator connected to a ground terminal;
    a second path including a grounded resonator; and
    a third path connecting the parallel arm resonator and the ground terminal; wherein
    the second path is connected in parallel with any of the at least one ladder filter circuit such that a first end of the second path is connected at a first portion of the at least one ladder filter circuit on the first path and a second end of the second path is connected at a second portion of the at least one ladder filter circuit on the first path; and a wiring defining the second path and a wiring defining the third path overlap each other as viewed from above.

13. The filter device according to claim 12, wherein an insulator is disposed between the wiring defining the second path and the wiring defining the third path.

14. The filter device according to claim 12, wherein the grounded resonator is a longitudinally coupled resonator.

15. The filter device according to claim 12, wherein the first path includes a transmit filter circuit and a receive filter circuit, the transmit filter circuit being one of the at least one ladder filter circuit to transmit a signal, the receive filter circuit being another one of the at least one ladder filter circuit to receive a signal.

16. The filter device according to claim 15, wherein the second path is connected in parallel with the transmit filter circuit and the receive filter circuit.

17. The filter device according to claim 15, wherein the transmit filter circuit includes four series arm resonators disposed on a series arm and three parallel arm resonators disposed on a parallel arm.

18. The filter device according to claim 17, wherein the series arm resonators and the parallel arm resonators define surface acoustic wave filters.

19. The filter device according to claim 15, wherein the receive filter includes two series arm resonators, two parallel arm resonators, and a longitudinally coupled resonator unit.

20. The filter device according to claim 19, wherein the longitudinally coupled resonator unit includes two 5-inter-digital-transducer longitudinally coupled resonators and three reflectors.

* * * * *